(12) United States Patent
Then et al.

(10) Patent No.: US 11,404,407 B2
(45) Date of Patent: Aug. 2, 2022

(54) IMPLANTS TO ENLARGE SCHOTTKY DIODE CROSS-SECTIONAL AREA FOR LATERAL CURRENT CONDUCTION

(71) Applicant: Intel Corporation, Santa Clara, CA (US)

(72) Inventors: Han Wui Then, Portland, OR (US); Sansaptak Dasgupta, Hillsboro, OR (US); Marko Radosavljevic, Portland, OR (US); Paul Fischer, Portland, OR (US); Walid Hafez, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 887 days.

(21) Appl. No.: 16/016,396

(22) Filed: Jun. 22, 2018

(65) Prior Publication Data

US 2019/0393210 A1    Dec. 26, 2019

(51) Int. Cl.
| | |
|---|---|
| *H01L 27/02* | (2006.01) |
| *H01L 29/20* | (2006.01) |
| *H01L 29/06* | (2006.01) |
| *H01L 29/872* | (2006.01) |
| *H01L 21/265* | (2006.01) |
| *H01L 29/51* | (2006.01) |
| *H01L 29/66* | (2006.01) |
| *H01L 29/423* | (2006.01) |

(52) U.S. Cl.
CPC .... *H01L 27/0255* (2013.01); *H01L 21/26546* (2013.01); *H01L 21/26586* (2013.01); *H01L 29/0657* (2013.01); *H01L 29/2003* (2013.01); *H01L 29/42376* (2013.01); *H01L 29/518* (2013.01); *H01L 29/66143* (2013.01); *H01L 29/872* (2013.01)

(58) Field of Classification Search
CPC .......... H01L 27/0255; H01L 21/26546; H01L 21/26586; H01L 29/0657; H01L 29/2003; H01L 29/42376; H01L 29/518; H01L 29/66143; H01L 29/872
USPC ........................................................ 257/76
See application file for complete search history.

(56) References Cited

U.S. PATENT DOCUMENTS

| | | | |
|---|---|---|---|
| 2008/0121895 A1* | 5/2008 | Sheppard .......... | H01L 29/66212 257/76 |
| 2008/0143421 A1* | 6/2008 | Yanagihara .......... | H01L 27/085 327/427 |
| 2011/0278598 A1* | 11/2011 | Renaud ............. | H01L 29/66462 257/77 |

(Continued)

*Primary Examiner* — Tu-Tu V Ho
(74) *Attorney, Agent, or Firm* — Schwabe, Williamson & Wyatt P.C.

(57) ABSTRACT

A semiconductor device is disclosed. The semiconductor device includes a substrate, an epitaxial layer above the substrate, a Schottky barrier material on the epitaxial layer, a Schottky metal contact extending into the Schottky barrier material, a fin structure that extends in a first direction, a first angled implant in a first side of the fin structure that has an orientation that is orthogonal to the first direction, and a second angled implant in a second side of the fin structure that has an orientation that is orthogonal to the first direction. The second side is opposite to the first side. A first cathode region and a second cathode region are coupled by parts of the first angled implant and the second angled implant that extend in the first direction.

21 Claims, 19 Drawing Sheets

(56) References Cited

U.S. PATENT DOCUMENTS

2015/0325567 A1\* 11/2015 Grivna .............. H01L 21/76224
  257/328

\* cited by examiner

CROSS SECTION

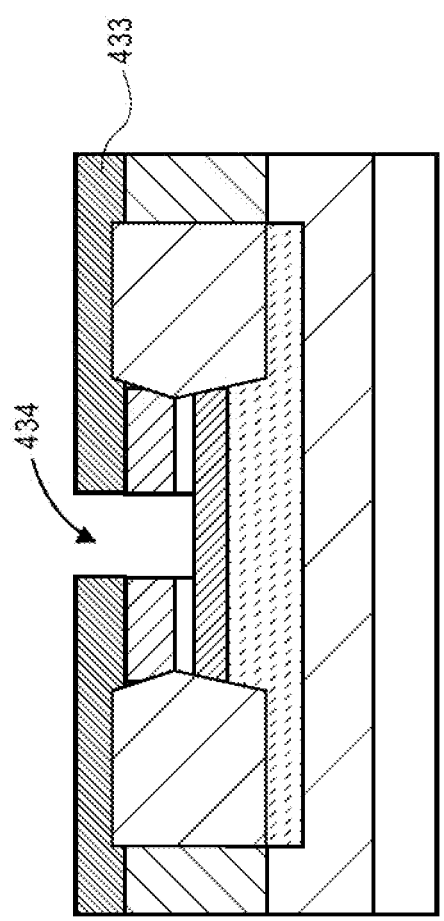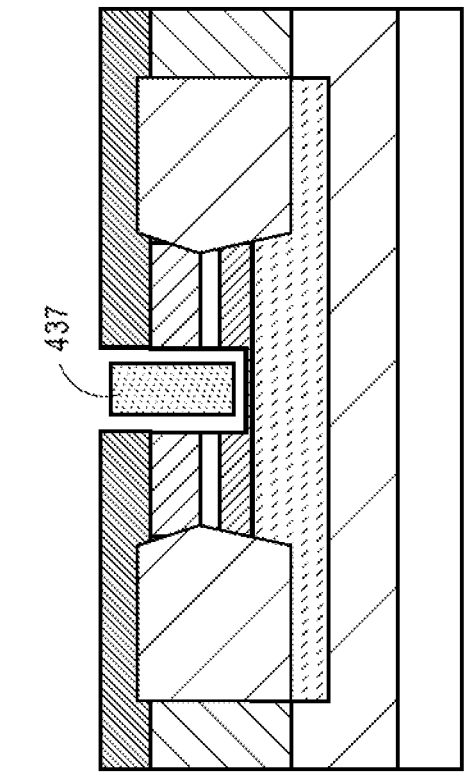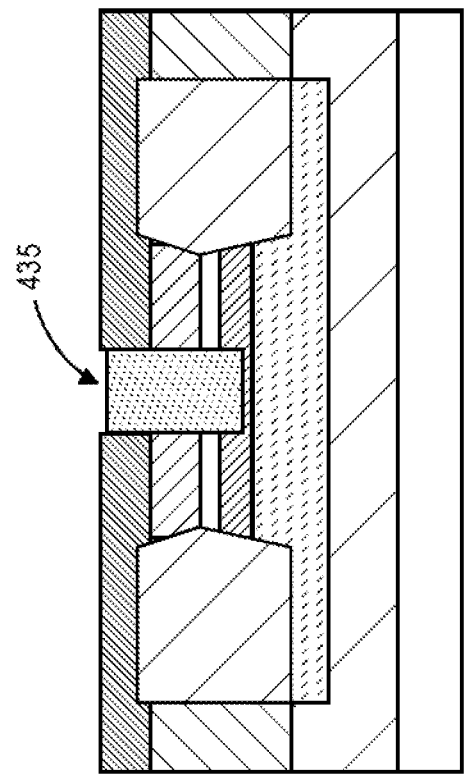

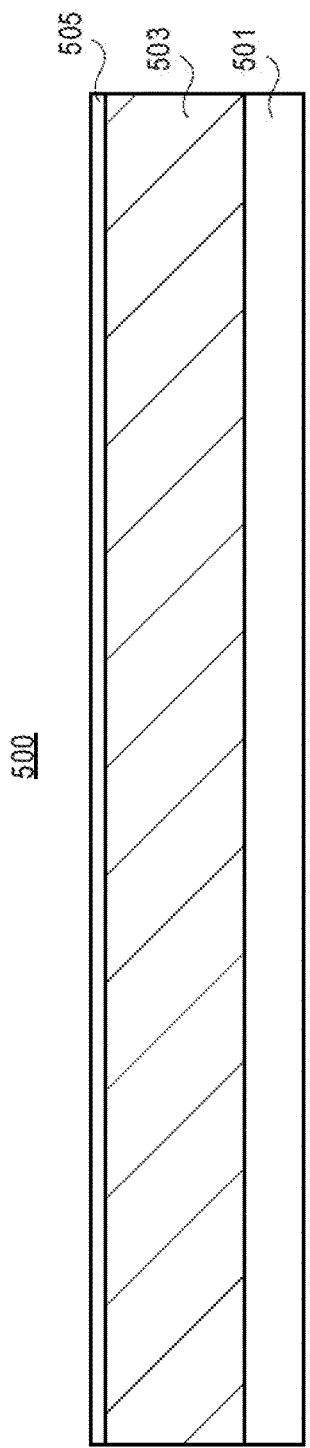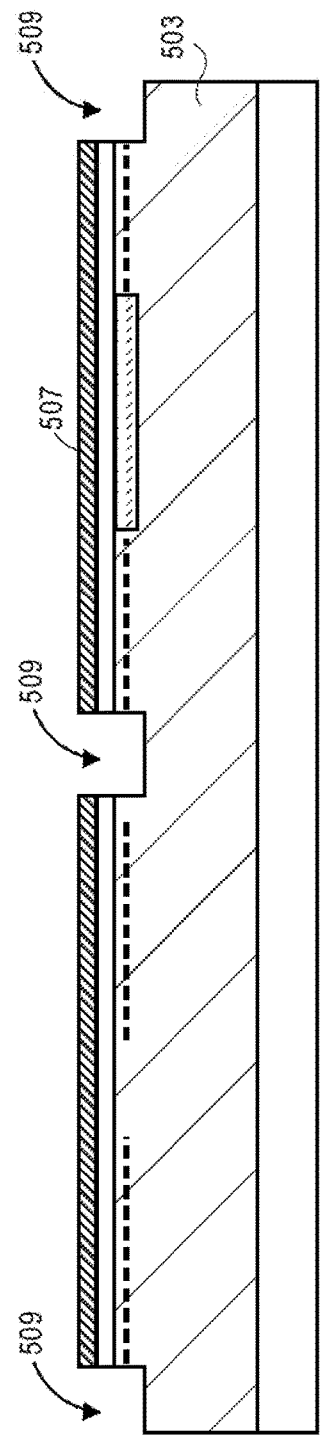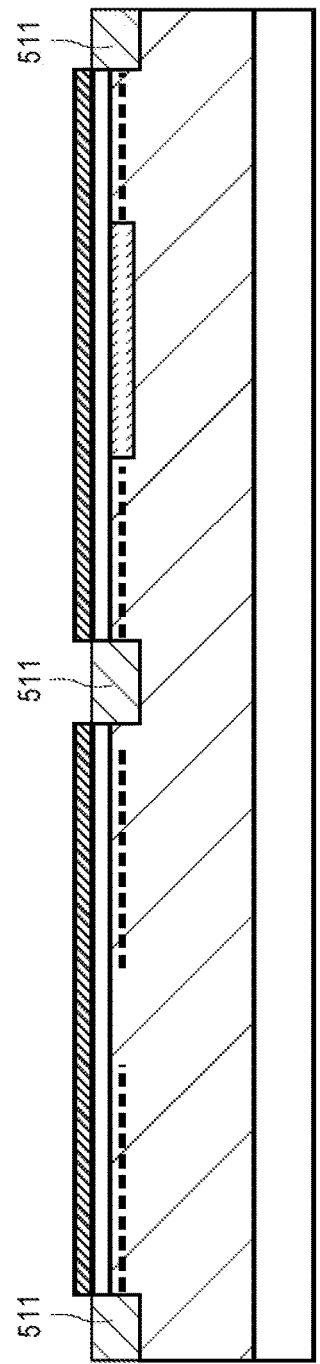

IMPLANTS TO ENLARGE SCHOTTKY DIODE CROSS-SECTIONAL AREA FOR LATERAL CURRENT CONDUCTION

TECHNICAL FIELD

Embodiments of the disclosure are in the field of Schottky diodes and Schottky diode fabrication and, in particular, Schottky diodes with implants to enlarge Schottky diode cross-sectional area for lateral current conduction.

Electrostatic discharge (ESD) involves sudden releases of electricity. The high peak voltage and current of such sudden releases of electricity can cause the catastrophic failure of sensitive integrated circuits (ICs). For example, if ESD protection is not present in a system, the high voltage of an ESD event can cause a large current spike to flow directly into the IC. To protect sensitive circuitry from electrical overstress failures, ESD protection diodes can be connected to the signal line between an interface connector and the IC. Upon the occurrence of an ESD event, the ESD protection diode can divert the current to ground to protect the IC.

Some conventional radio frequency (RF) systems use on-chip ESD protection circuits. For example, some RF frontend systems require on-chip ESD protection circuits. In gallium nitride ICs, typically, a Schottky diode using two dimensional electron gas (2DEG) is used. The design of ESD protection circuits for such systems can present significant challenges. For example, saturation of 2DEG at high fields limit the maximum current per unit width. A shortcoming of conventional ESD protection approaches that use Schottky diodes is that they do not adequately address the saturation of 2DEG at high fields.

BRIEF DESCRIPTION OF THE DRAWINGS

FIGS. 4A-4L are illustrations of cross-sections of a semiconductor structure that includes integrated Schottky diode and transistor components during a fabrication process according to an embodiment.

DESCRIPTION OF THE EMBODIMENTS

Figure 1:
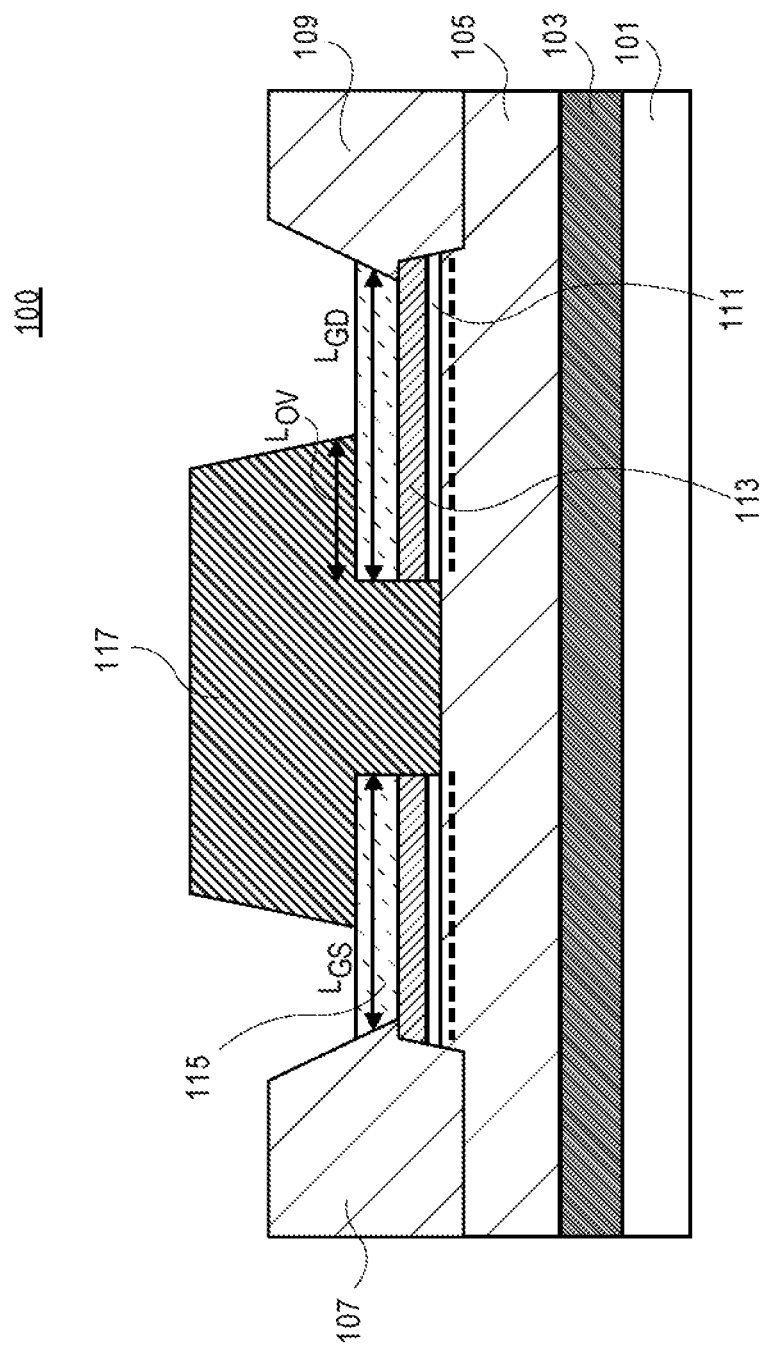
FIG. 1 is an illustration of a gallium nitride Schottky diode for radio frequency (RF) device frontend use according to a previous approach.

Approaches to increasing the maximum current per unit width that can be handled by a Schottky diode by forming implants that enlarge the Schottky diode cross-sectional area for lateral current conduction are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

A shortcoming of previous approaches to providing radio frequency (RF) frontend electrostatic discharge (ESD) protection is the saturation of two dimensional electron gas (2DEG) at high electric fields. The saturation of 2DEG at high fields limits the maximum current per unit width that can be diverted by the diode. A process and device that addresses the shortcomings of such previous ESD protection circuits for RF devices is disclosed. In an embodiment, a larger cross-sectional area of a Schottky diode than is provided in the previous approaches is created for lateral conduction of current. The larger cross-sectional area enables the Schottky diode to divert a greater amount of ESD diode current per unit width. In an embodiment, the larger cross-sectional area is formed by making angled implants into a fin structure of the Schottky diode that serves to extend the cross-sectional area of the Schottky diode that is used to conduct current.

In other embodiments, implants are formed in the surface of an epitaxial layer located underneath the anode. The implanted "tip" enables higher ESD current per unit width than the Schottky diodes that use 2DEG. It should be appreciated that the Schottky diodes that use larger cross-sectional areas to accommodate higher ESD current per unit width enable the production of chips that have smaller chip areas and hence smaller parasitic capacitances associated with the ESD diodes. This improves circuit performance and reduces total area and cost.

FIG. 1 is an illustration of a gallium nitride Schottky diode 100 for RF device frontend use that is structured in accordance with a previous approach. The gallium nitride Schottky diode 100 is a semiconductor diode that is formed by the junction of a semiconductor (e.g., epitaxial layer 105) and a metal (e.g., nickel anode 117). FIG. 1 shows substrate 101, buffer 103, gallium nitride epitaxial layer 105, first cathode contact 107, second cathode contact 109, aluminum nitride 111, aluminum indium nitride layer 113, hardmask 115 and nickel anode 117.

Referring to FIG. 1, substrate 101 is the bottommost layer of the gallium nitride Schottky diode 100 structure. The buffer 103 is formed above the substrate 101. The gallium nitride epitaxial layer 105 is formed above the buffer 103. The aluminum nitride layer 111 is formed above the gallium nitride epitaxial layer 105. The aluminum indium nitride layer 113 is formed above the aluminum nitride layer 111.

The hardmask 115 is formed above the aluminum indium nitride layer 113. The nickel anode 117 extends through the hardmask 115, the aluminum indium nitride layer 113 and the aluminum nitride layer 111 and contacts the top surface of the gallium nitride epitaxial layer 105. In FIG. 1, the junction between the nickel anode 117 and the gallium nitride epitaxial layer 105 is a metal-semiconductor junction where the Schottky barrier of the gallium nitride Schottky diode 100 is formed. The gallium nitride Schottky diode 100 uses 2DEG lateral conduction. However, saturation of 2DEG at high fields limits the maximum current per unit width that can be conducted by the diode. The saturation of 2DEG is the point at which the current conduction of the diode cannot further increase.

Figures 2A, 2B:
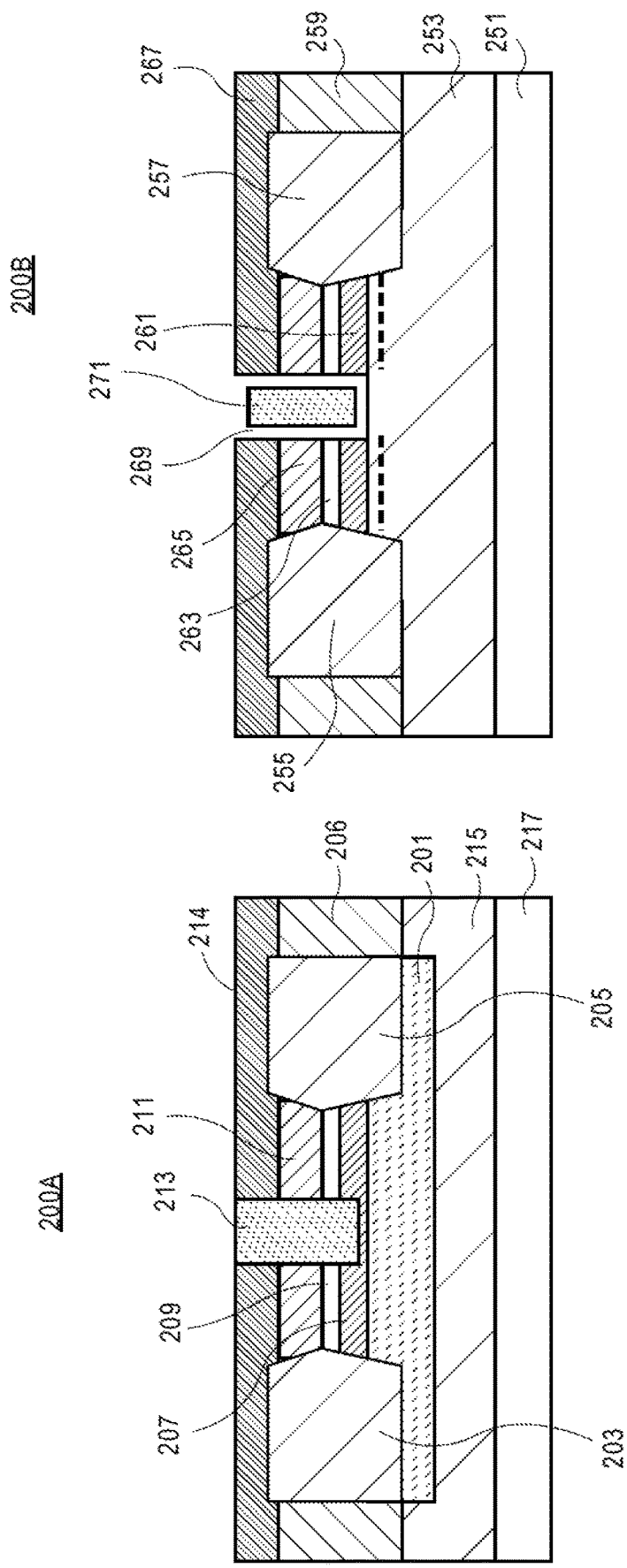
FIG. 2A is an illustration of a diode with angled FIN implants to increase maximum current per unit width according to an embodiment.
FIG. 2B is an illustration of a transistor for RF device frontend use according to an embodiment.

FIG. 2A is an illustration of a diode 200A with angled FIN implants to increase maximum current conduction per unit width. FIG. 2A shows lateral conduction region 201, first cathode region 203, second cathode region 205, insulator 206, Schottky barrier material 207, dielectric 209, hardmask 211, Schottky metal 213, insulator 214, epitaxial layer 215 and substrate 217.

Referring to FIG. 2A, substrate 217 is the bottommost layer of the diode 200A structure. The epitaxial layer 215 is formed above the substrate 217. The first cathode region 203 is formed above the epitaxial layer 215. The second cathode region 205 is formed above the epitaxial layer 215. The insulator 206 is formed above the epitaxial layer 215. The Schottky barrier material 207 is formed above the lateral conduction region 201. The lateral conduction region 201 is formed above the epitaxial layer 215. The hardmask 211 is formed above the dielectric 209. The dielectric 209 is formed above the Schottky barrier material 207. The insulator 214 is formed above the hardmask 211. In an embodiment, the Schottky diode 200A is integrated with the transistor 200B shown in FIG. 2B. In other embodiments, the Schottky diode 200A may not be integrated with a transistor.

In an embodiment, the lateral conduction region 201 can be formed from n– gallium nitride. In other embodiments, the lateral conduction region can be formed from other materials. In an embodiment, the first cathode region 203 can be formed from doped indium gallium nitride. In other embodiments, the first cathode region can be formed from other materials. In an embodiment, the second cathode region 205 can be formed from indium gallium nitride. In other embodiments, the second cathode region 205 can be formed from other materials. In an embodiment, the insulator 206 can be formed from silicon dioxide. In other embodiments, the insulator 206 can be formed from other materials. In an embodiment, the Schottky barrier material 207 can be formed from aluminum indium gallium nitride. In other embodiments, the Schottky barrier material 207 can be formed from other materials. In an embodiment, the dielectric 209 can be formed from aluminum oxide. In other embodiments, the dielectric 209 can be formed from other materials. In an embodiment, the hard mask 211 can be formed from silicon nitride or silicon dioxide. In other embodiments, the hardmask 211 can be formed from other materials. In an embodiment, the Schottky metal 213 can be formed from nickel. In other embodiments, the Schottky metal 213 can be formed from other materials. In an embodiment, the epitaxial layer 215 can be formed from gallium nitride. In other embodiments, the epitaxial layer 215 can be formed from other materials. In an embodiment, the substrate 217 can be formed from silicon. In other embodiments the substrate 217 can be formed from other materials.

Referring to FIG. 2A, the lateral current conduction region 201 is an implant region formed in a FIN component of the semiconductor structure from which diode 200A is formed that increases the size of the cross-section of diode 200A that supports lateral current conduction. The lateral current conduction implant 201 can be created by a merger of implants formed in opposing sides of a FIN structure (described in detail hereinbelow). In an embodiment, the lateral current conduction implant 201 substantially increases the cross-section of the gallium nitride that supports current flow in comparison to the current conduction region of 2DEG devices.

The first cathode region 203 and the second cathode region 205 can be coupled to a cathode electrode/terminal (not shown) of the diode 200. Using the first cathode region 203 and the second cathode region 205 enables the diode 200 to route/pass more current than can be routed using one of the first cathode region 203 and the second cathode region 205. In an embodiment, individual ones of the first cathode region 203 or the second cathode region 205 can be used by allowing the other of the first cathode region 203 or the second cathode region 205 to float. In the FIG. 2A embodiment, the configuration of the first cathode region 203 and the second cathode region 205 in the diode 200A provides a symmetrical cathode configuration.

The Schottky metal 213 includes a bottom end that extends into the Schottky barrier material 207 and a top end that can be coupled to a terminal. The nature of the interface between the Schottky metal 213 and the Schottky barrier material 207 enables fast switching because of the lack of reverse recovery time. In an embodiment, the Schottky barrier material 207 is formed above the epitaxial layer 215 and extends around a bottom portion of Schottky metal 213. The Schottky barrier material 207 is the semiconductor portion of the metal-semiconductor junction that is formed by Schottky metal 213 and Schottky barrier material 207.

In operation, upon the occurrence of an ESD event, the Schottky diode 200A is forward biased and conducts current between the anode and the cathode. The Schottky diode 200A routes the ESD current to ground, for example. In this manner, the current is prevented from damaging circuitry such as RF device frontend circuitry that can include transistors (which can be located at the front end of an associated RF device). In an embodiment, because the Schottky diode 200A has a greater cross-sectional area for lateral conduction of current than does 2DEG approaches such as described with reference to FIG. 1, the Schottky diode 200A can handle more ESD diode current per unit width and enables the use of less chip area for diodes than those approaches. Thus, smaller parasitic capacitances are associated with the Schottky diode 200A. In an embodiment, the Schottky diode 200A provides improved circuit performance, reduced total area and reduced cost.

FIG. 2B is an illustration of a transistor 200B for RF device frontend use according to an embodiment. FIG. 2B shows substrate 251, epitaxial layer 253, source 255, drain 257, insulator 259, semiconductor 261, insulator 263, insulator 265, insulator 267, high-k dielectric 269 and metal gate 271.

Referring to FIG. 2B, substrate 251 is the bottommost layer of the transistor 200B structure. The epitaxial layer 253 is formed above the substrate 251. The source 255 is formed above the epitaxial layer 253. The drain 257 is formed above the epitaxial layer 253. The insulator 259 is formed above the epitaxial layer 253. The semiconductor 261 is formed above the epitaxial layer 253. The insulator 263 is formed above the semiconductor 261. The insulator 265 is formed above the insulator 263. The insulator 267 is formed above the insulator 259, the source 255 and the drain 257. The high-k dielectric 269 is formed on the bottom and sidewalls of metal gate 271. In an embodiment, the transistor 200B can be integrated with the Schottky diode 200A shown in FIG. 2A. In addition, in an embodiment, the transistor 200B can be fabricated alongside the Schottky diode 200A in a process that can include several of the same fabrication operations that are used in the fabrication of the Schottky diode 200A.

In an embodiment, the epitaxial layer 253 can be formed from gallium nitride. In other embodiments, the epitaxial layer 253 can be formed from other materials. In an embodiment, the source 255 can be formed from indium gallium nitride. In other embodiments the source 255 can be formed from other materials. In an embodiment, the drain 257 can be formed from indium gallium nitride. In other embodiments, the drain 257 can be formed from other materials. In an embodiment, the insulator 259 can be formed from silicon dioxide. In other embodiments, the insulator 259 can be formed from other materials. In an embodiment, the semiconductor 261 can be formed from aluminum indium gallium nitride. In other embodiments, the semiconductor 261 can be formed from other material. In an embodiment, the insulator 263 can be formed from aluminum oxide. In other embodiments, the insulator 263 can be formed from other materials. In an embodiment, the insulator 265 can be formed from silicon nitride or silicon dioxide. In other embodiments, the insulator 265 can be formed from other materials. In an embodiment, the insulator 267 can be formed from silicon nitride or silicon dioxide. In other embodiments, the insulator 267 can be formed from other materials. In an embodiment, the metal gate 271 can be formed from nickel. In other embodiments, the metal gate 271 can be formed from other materials.

In operation, the transistor 200B is turned on when a voltage that is applied to the metal gate 271 reaches the threshold voltage of the transistor 200B. In an embodiment, the transistor 200B can be a part of circuitry that is protected by the Schottky diode 200A. In such case, the Schottky diode 200A routes the ESD current away from transistor 200B to ground. In this manner, the current is prevented from damaging circuitry such as RF device frontend circuitry that can include transistor 200B. In an embodiment, because the Schottky diode 200A has a greater cross-sectional area for lateral conduction of current than does the 2DEG approaches described herein, the Schottky diode 200A can handle more ESD current per unit width than does such 2DEG approaches. The capacity to handle more ESD current per unit width facilitates the use of less chip space for diodes than does 2DEG approaches. Moreover, the higher ESD current per unit width enables the Schottky diode 200B to provide a greater level of protection to RF circuitry.

Figure 3:
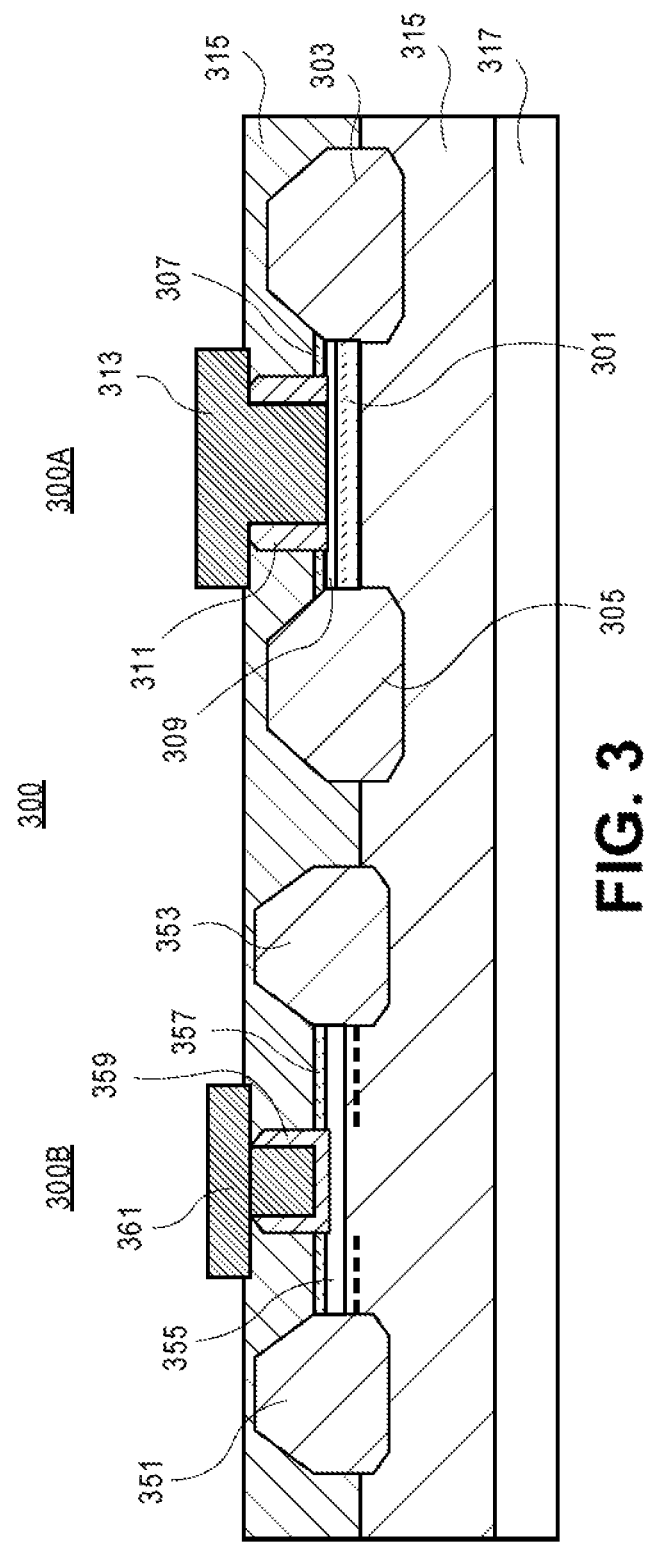
FIG. 3 is an illustration of a semiconductor structure with integrated Schottky diode and transistor components according to an embodiment.

FIG. 3 is an illustration of an integrated Schottky diode 300A and transistor 300B of semiconductor structure 300 according to an embodiment. FIG. 3 shows Schottky diode 300A, that includes lateral conduction implant 301, first cathode region 303, second cathode region 305, semiconductor 307, semiconductor 309, spacers 311, anode 313, epitaxial layer 315 and substrate 317. FIG. 3 also shows transistor 300B, that includes in addition to components shared with Schottky diode 300A, source 351, drain 353, semiconductor 355, semiconductor 357, gate insulator 359 and gate 361.

Referring to FIG. 3, in the region of the semiconductor structure 300 corresponding to the Schottky diode 300A, the epitaxial layer 315 is formed above the substrate 317. The lateral conduction implant 301 is formed in the epitaxial layer 315. The first cathode region 303 is formed above the epitaxial layer 315. The second cathode region 305 is formed above the epitaxial layer 315. The semiconductor 307 is formed above the semiconductor 309 and adjacent the spacers 311. The semiconductor 309 is formed above the lateral conduction implant 301. The spacers 311 are formed above the semiconductor 309. The Schottky metal 313 is formed above the semiconductor 309.

In the region of the semiconductor structure 300 corresponding to the transistor 300B, the source region 351 and the drain region 353 are formed above the epitaxial layer 315. The semiconductor 357 is formed above the semiconductor 355 and adjacent the gate insulator 359. The semiconductor 355 is formed above the epitaxial layer 315.

In an embodiment the epitaxial layer 315 can be formed from gallium nitride. In other embodiments, the epitaxial layer 315 can be formed from other materials. In an embodiment, the lateral conduction implant 301 can be formed from n-type gallium nitride. In other embodiments, the lateral conduction implant 301 can be formed from other materials. In an embodiment, the first cathode region 303 can be formed from indium gallium nitride. In other embodiments, the first cathode region 303 can be formed from other materials. In an embodiment, the second cathode region 305 can be formed from indium gallium nitride. In other embodiments, the second cathode region 305 can be formed from other materials. In an embodiment, the semiconductor 307 can be formed from aluminum indium gallium nitride. In other embodiments, the semiconductor 307 can be formed from other materials. In an embodiment, the semiconductor 309 can be formed from aluminum nitride. In other embodiments, the semiconductor 309 can be formed from other materials. In an embodiment, the spacers 311 can be formed from silicon dioxide. In other embodiments, the spacers 311 can be formed from other materials. In an embodiment, the Schottky metal 313 can be formed from nickel. In other embodiments, the Schottky metal 313 can be formed from other materials. In an embodiment, the source region 351 can be formed from indium gallium nitride. In other embodiments, the source region 351 can be formed form other materials. In an embodiment, the drain region 353 can be formed from indium gallium nitride. In other embodiments, the drain region 353 can be formed from other materials. In an embodiment, the semiconductor 357 can be formed from aluminum indium gallium nitride, aluminum indium nitride or aluminum gallium nitride. In other embodiments, the semiconductor 357 can be formed from other materials. In an embodiment, the semiconductor 355 can be formed from aluminum nitride. In other embodiments, the semiconductor 355 can be formed from other materials. In an embodiment, the gate 361 can be formed from nickel. In other embodiments, the gate 361 can be formed from other materials.

Referring to FIG. 3, the lateral current conduction implant 301 is an implant formed in the epitaxial layer 315 of the semiconductor structure 300 from which diode 300A is formed. Lateral current conduction implant 301 increases the size of the cross-section of the diode 300A that supports current flow. In an embodiment, the lateral current conduction implant 301 increases the cross-section of the gallium nitride that supports current flow in comparison to the current conduction region of 2DEG devices. In an embodiment, the lateral current conduction implant 301 transforms the conduction channel from a 2 dimensional planar channel that is confined to the interface at the top surface of the epitaxial layer 315 into a 3 dimensional channel that extends away from the interface to a depth that is defined by the depth of the implants.

The first cathode region 303 and the second cathode region 305 can be coupled to an electrode (not shown) of the diode 300A. The configuration of the first cathode region 303 and the second cathode region 305 as shown in FIG. 3 enables the diode 300A to handle more current than can be handled using individual ones of the first cathode region 303 and the second cathode region 305. In an embodiment, individual ones of the first cathode region 303 or the second cathode region 305 can be used by allowing the cathode region that is not used to float.

In operation, upon the occurrence of an ESD event, the Schottky diode 300A is forward biased and routes the ESD current to ground for example. In this manner, the ESD current is prevented from damaging circuitry such as RF device frontend circuitry that can include transistors (e.g., transistor 300B which can be located at the front end of an associated RF device). In an embodiment, because the Schottky diode 300A has a greater cross-sectional area for lateral conduction of current than does 2DEG approaches, the Schottky diode 300A can handle more ESD current per unit width and can use less chip area than diodes that use 2DEG conduction. Thus, the Schottky diode 300A exhibits smaller parasitic capacitances. In an embodiment, the Schottky diode 300A provides improved circuit performance, reduced total area and reduced cost.

FIGS. 4A-4L are illustrations of cross-sections of a semiconductor structure during a process of fabrication of a diode that includes implants for increased lateral current conduction cross-section and an integrated transistor.

Figure 4A:
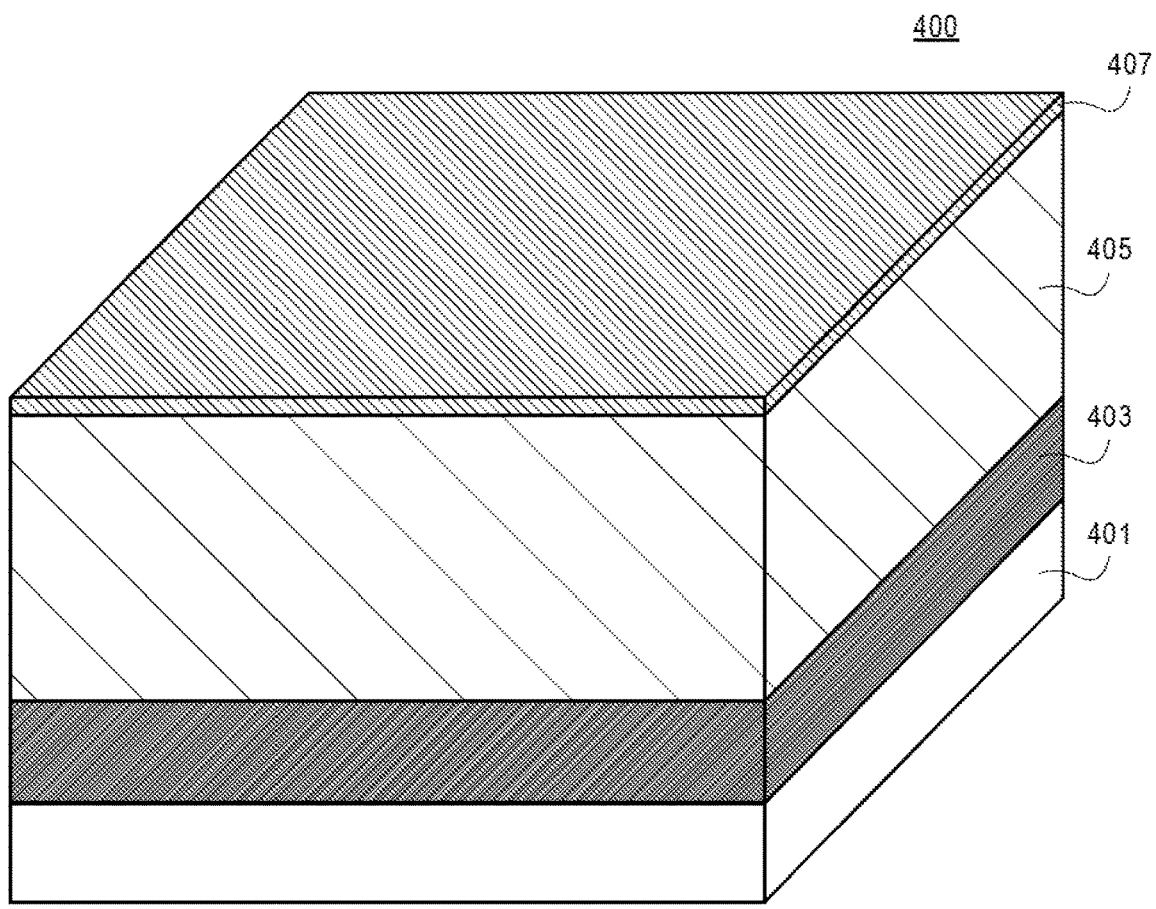

Referring to FIG. 4A, after a plurality of operations, a cross-section of semiconductor structure 400 includes a buffer layer 403 that is formed on a semiconductor substrate 401, a semiconductor layer 405 that is formed on the buffer layer 403 and a Schottky barrier layer 407 that is formed on the semiconductor layer 405.

Figure 4B:
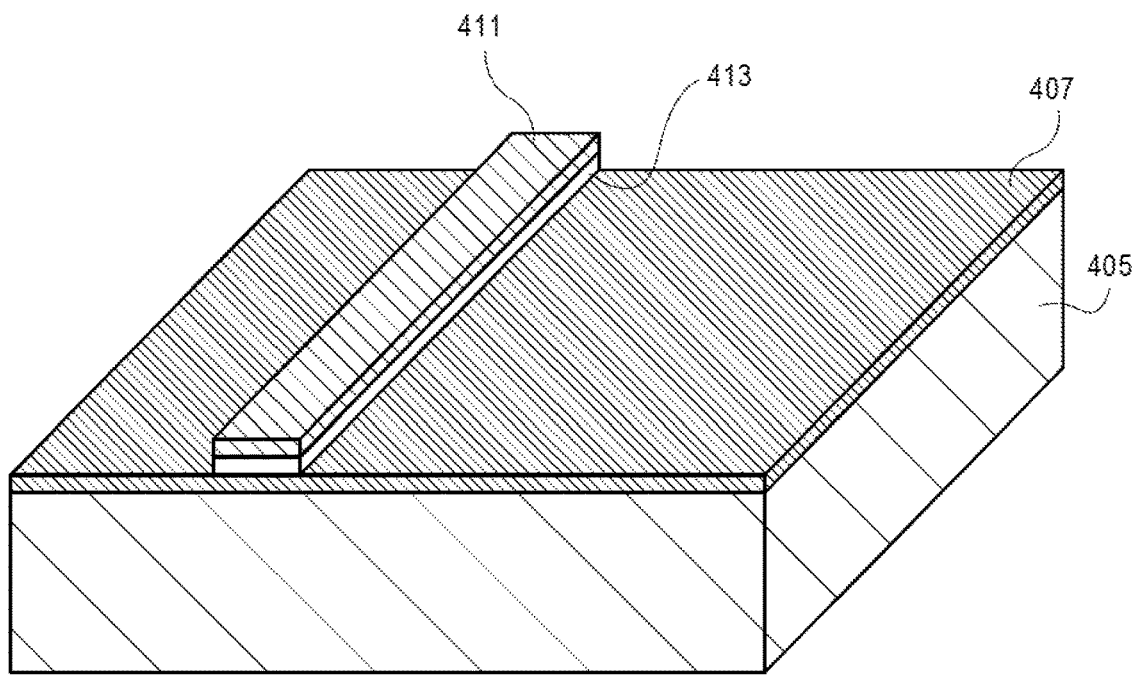

Referring to FIG. 4B, after one or more operations that result in the cross-section shown in FIG. 4A, a hardmask 411 and an insulator 413 is formed on the Schottky barrier layer 407. In an embodiment, the hardmask 411 is formed on the top surface of the insulator 413.

Figure 4C:
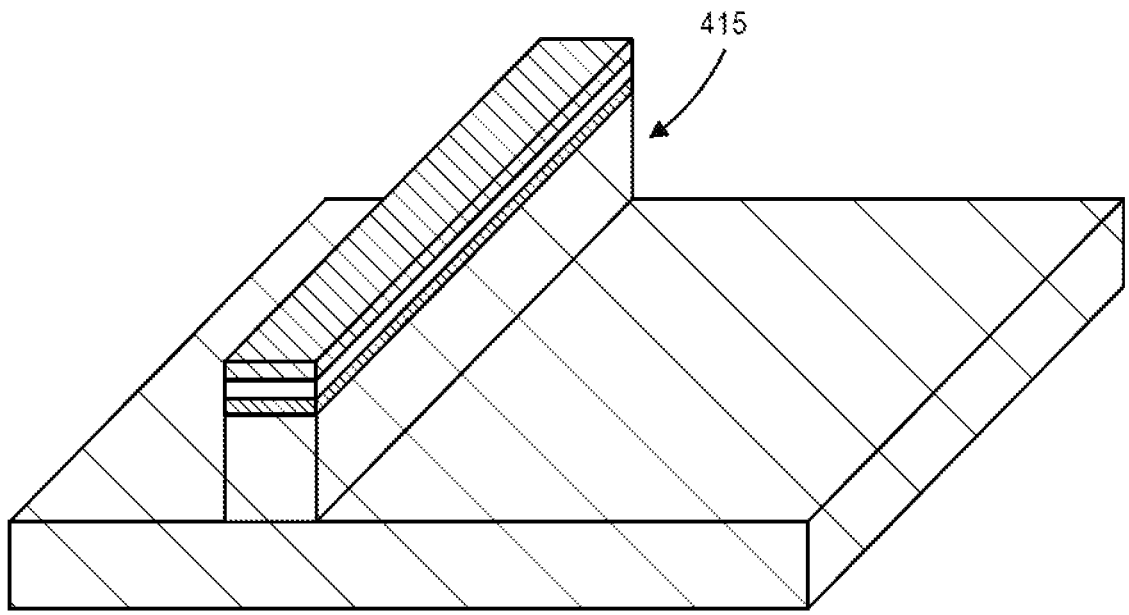

Referring to FIG. 4C, after one or more operations that result in the cross-section shown in FIG. 4B, a FIN 415 is formed. In an embodiment, the FIN 415 is formed by removing semiconductor material 405 not protected by the hardmask 411.

Figure 4D:
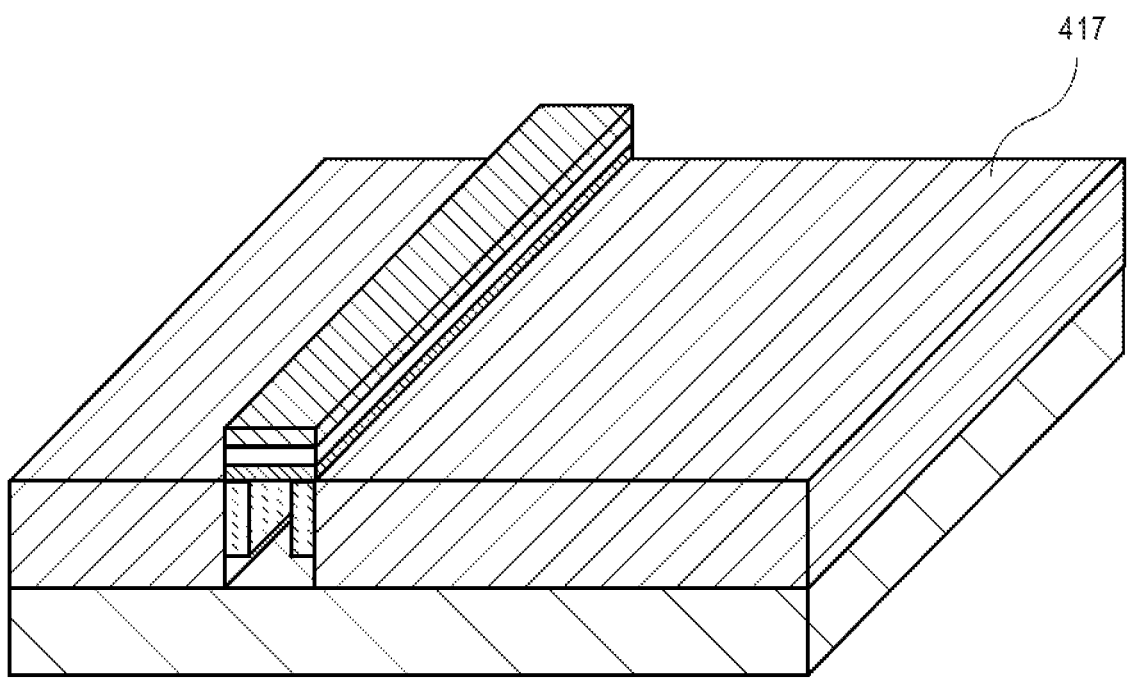

Referring to FIG. 4D, after one or more operations that result in the cross-section shown in FIG. 4C, an insulator layer 417 is formed above the semiconductor layer 405. In an embodiment, the insulator layer 417 is grown above the recessed portion of semiconductor layer 405. In an embodiment, the insulator layer 417 can be formed from an oxide. In other embodiments, the insulator layer 417 can be formed from other materials.

Figure 4E:
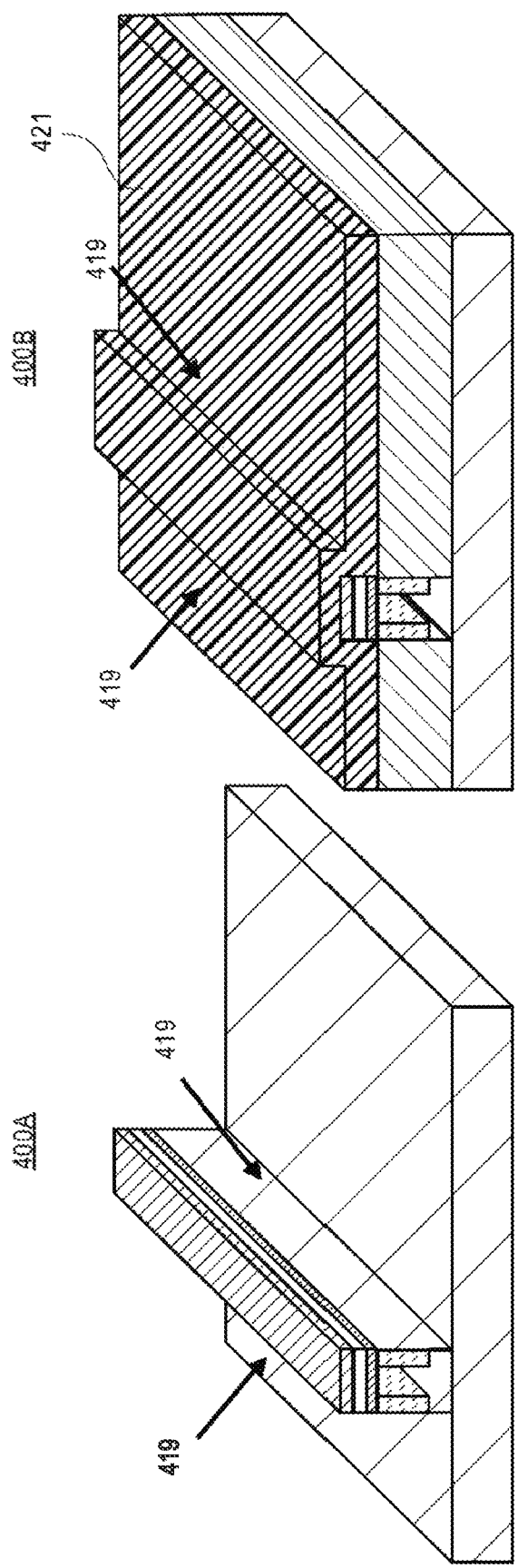

Referring to FIG. 4E, after one or more operations that result in the cross-section shown in FIG. 4D, the insulator layer 417 is partially removed and implants 419 are formed in the sides of FIN 415. In an embodiment, the implants 419 are angled. In other embodiments, the implants 419 may not be angled. In an embodiment, a mask 421 is formed on the top surface of the transistor 400B portion of the semiconductor structure 400 in order to protect the transistor 400B portion of the semiconductor structure 400 from the implants 419.

Figure 4F:
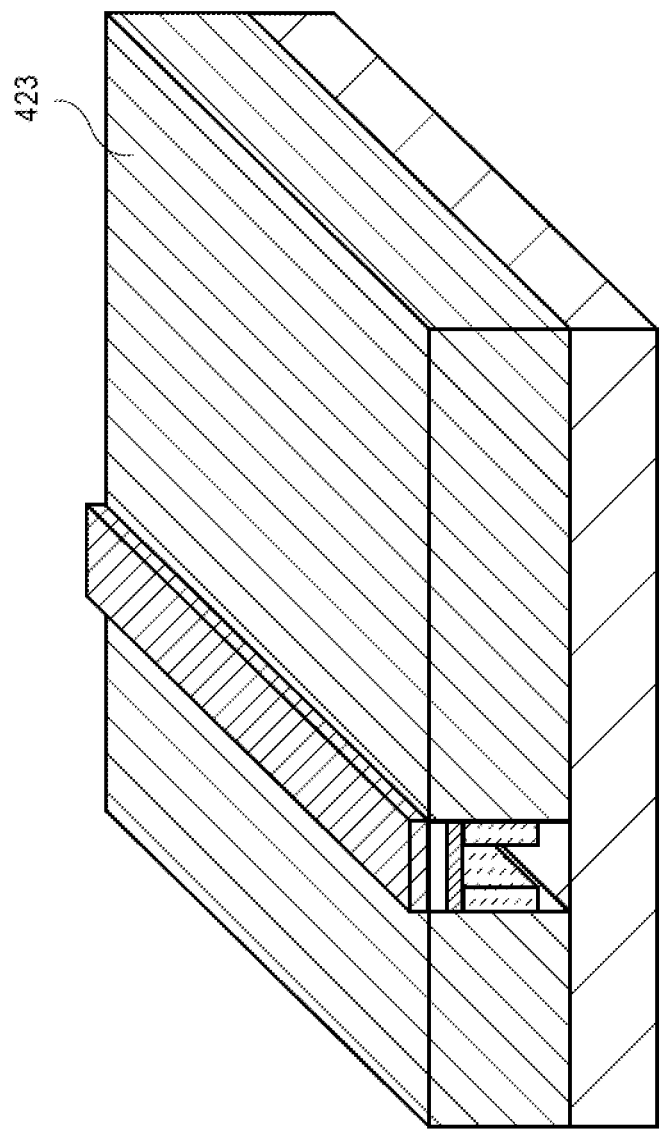

Referring to FIG. 4F, after one or more operations that result in the cross-section shown in FIG. 4E, insulator material 423 is grown above implants 419.

Figure 4G:
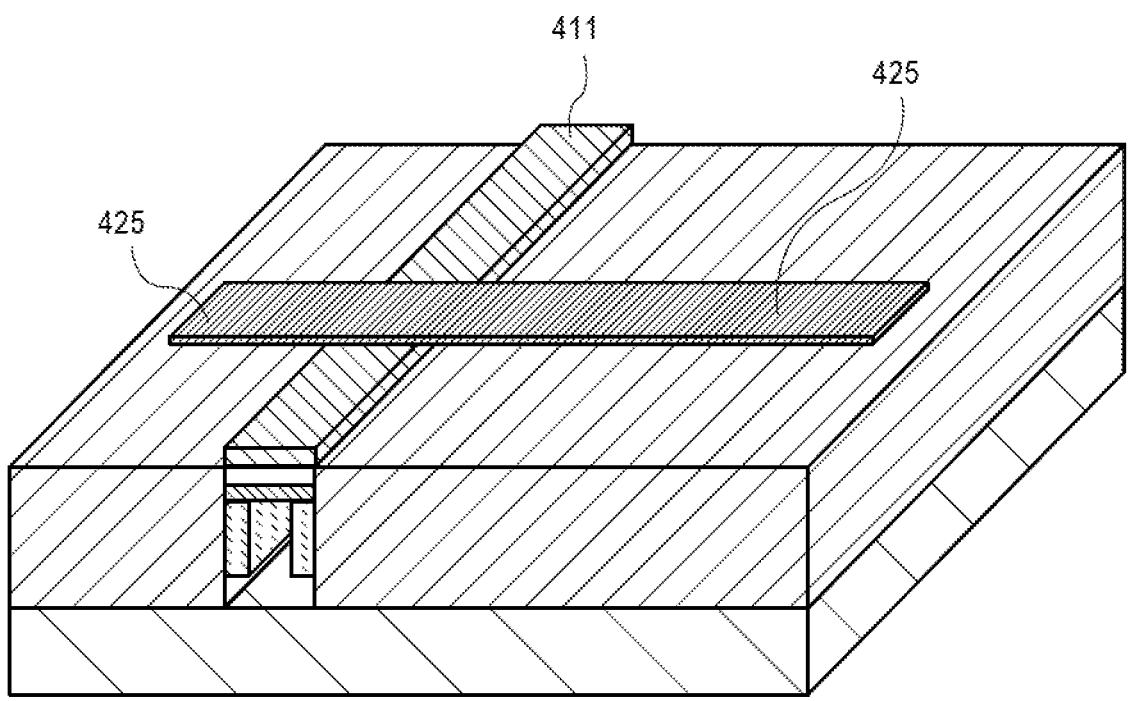
Figure 4G:
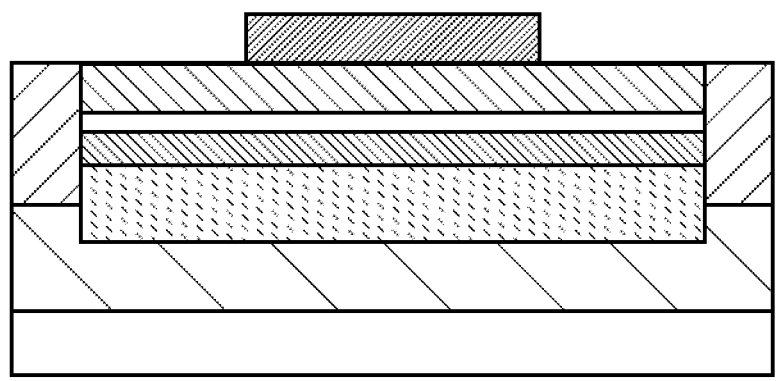

Referring to FIG. 4G, at top, after one or more operations that result in the cross-section shown in FIG. 4F, a mask 425 is formed above insulator material 423 and hardmask 411. FIG. 4G, at bottom, shows a cross-sectional view that is orthogonal to the cross-sectional view that is shown at top.

Figure 4H:
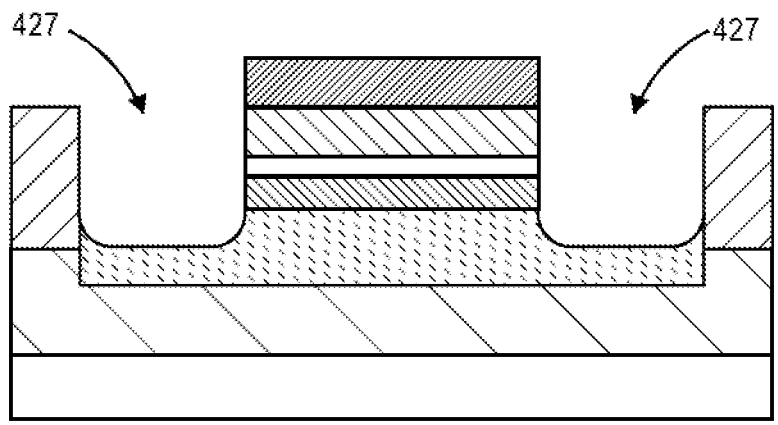

Referring to FIG. 4H, after one or more operations that result in the cross-section shown in FIG. 4G, an epitaxial undercut 427 operation is performed.

Figure 4I:
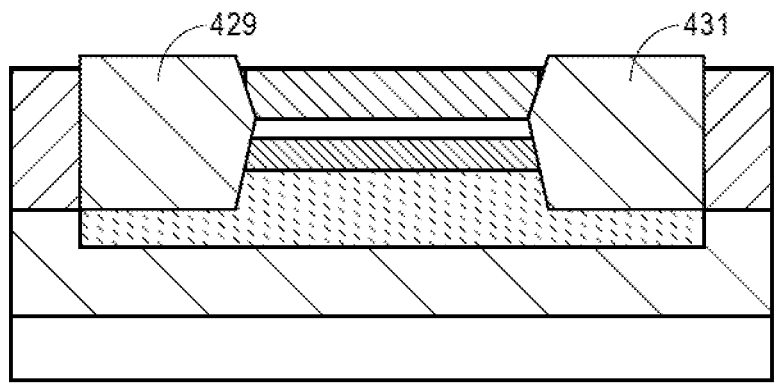

Referring to FIG. 4I, after one or more operation that result in the cross-section shown in FIG. 4H, first cathode 429 and second cathode 431 epitaxial material is grown in the spaces formed in the operations associated with FIG. 4H. In an embodiment, the first cathode 429 and second cathode 431 epitaxial material can include indium gallium nitride.

Figure 4J:
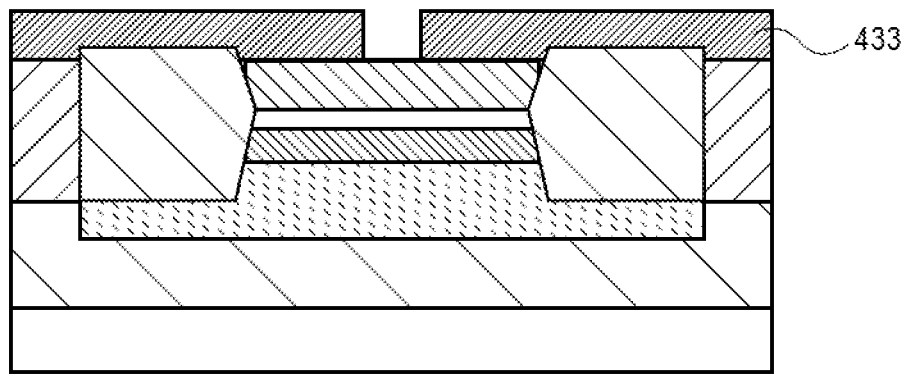

Referring to FIG. 4J, after one or more operations that result in the cross-section shown in FIG. 4I, a mask 433 is formed on the top surface of semiconductor structure 400.

Referring to FIG. 4K, after one or more operations that result in the cross-section shown in FIG. 4J, a trench 434 is formed using the mask 433.

Referring to FIG. 4L, after one or more operations that result in the cross-section shown in FIG. 4K, the trench 434 is filled with metal anode material 435. In an embodiment, as part of the same operation, the transistor gate trench is filled with metal gate material 437.

Figure 5D:
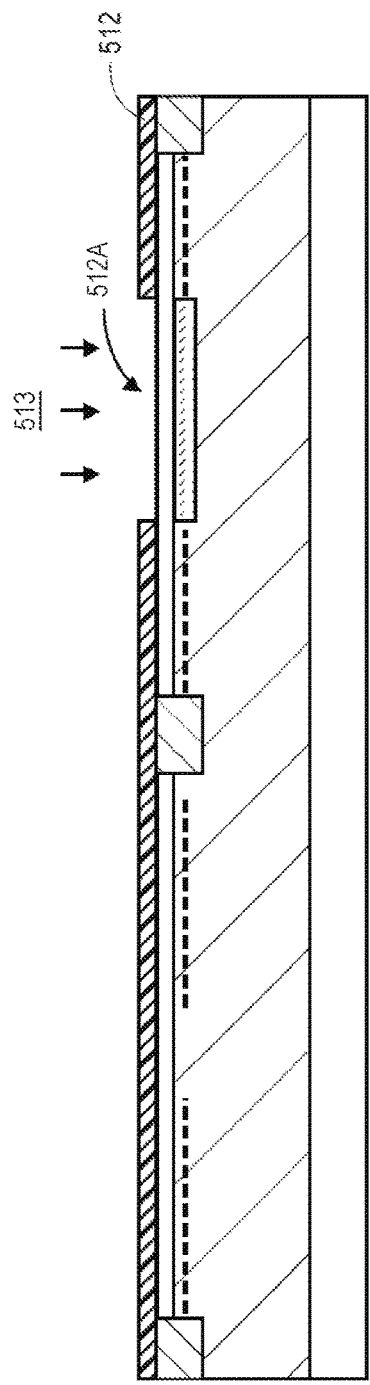
FIGS. 5A-5Q are illustrations of cross-sections of a semiconductor structure that includes integrated Schottky diode and transistor components during a fabrication process according to an embodiment.
Figure 5E:
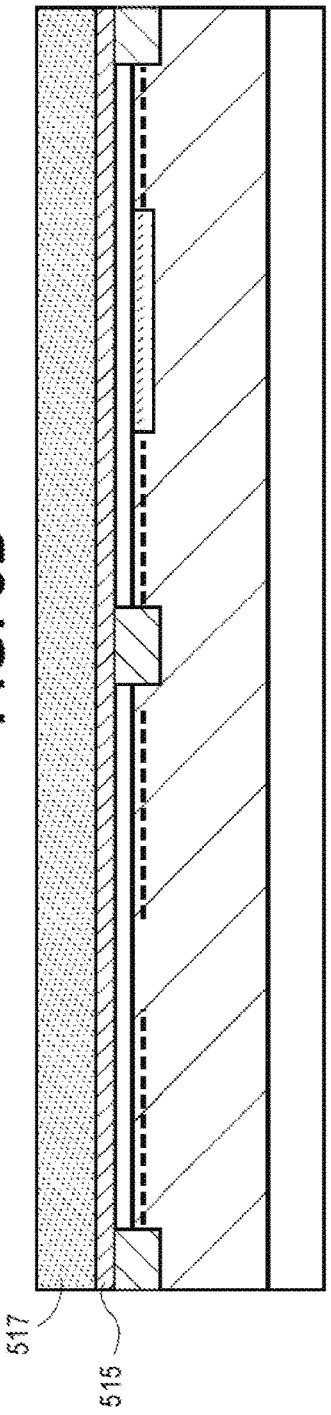
Figure 5F:
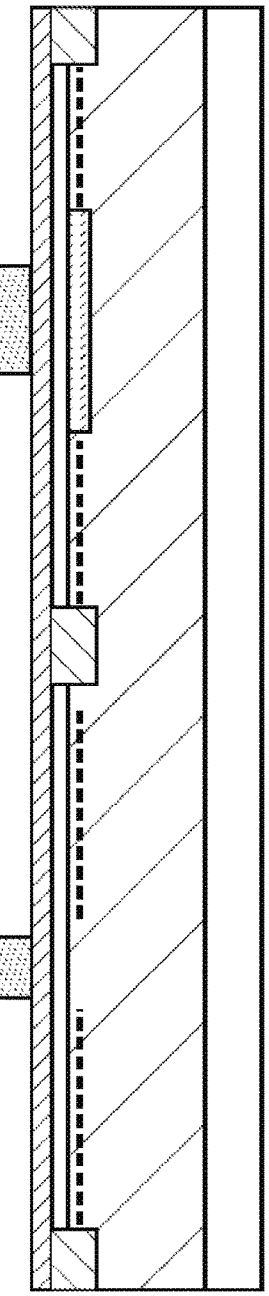
Figure 5G:
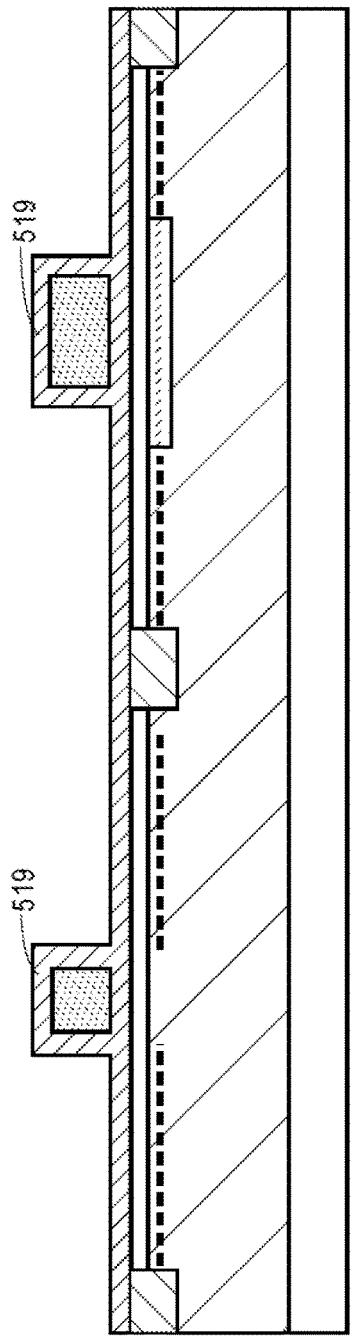
Figure 5H:
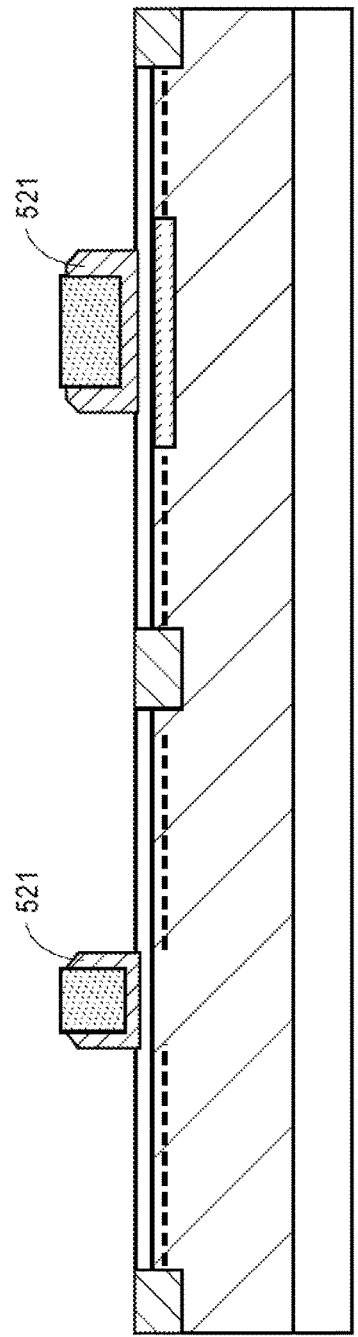
Figure 5I:
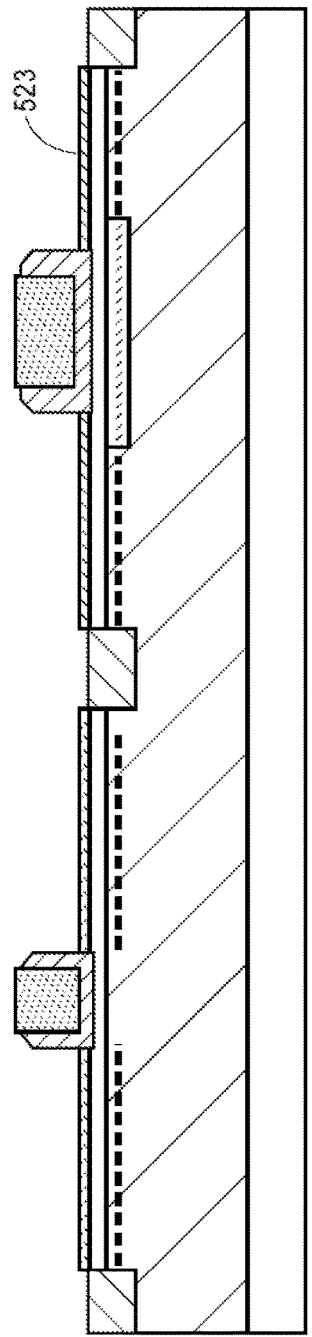
Figure 5J:
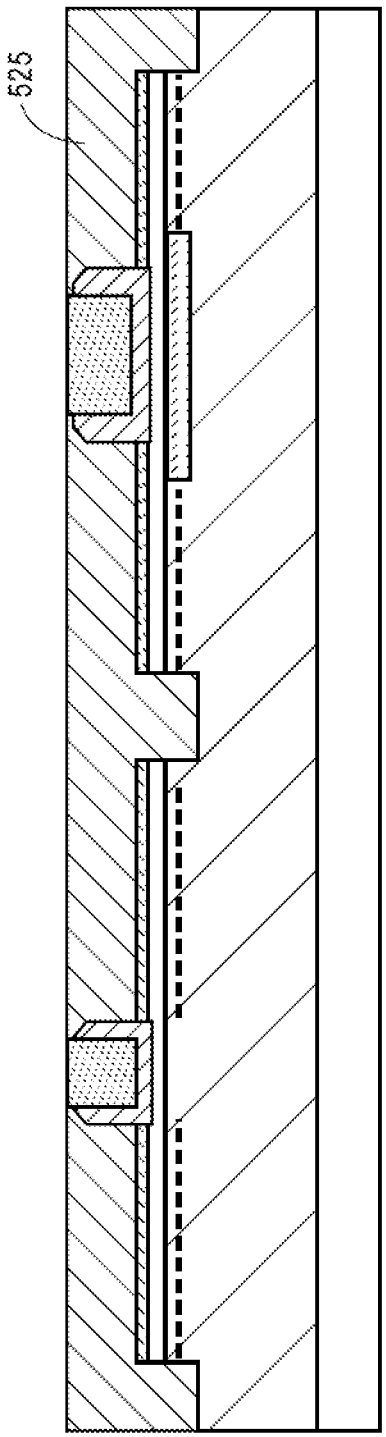
Figure 5K:
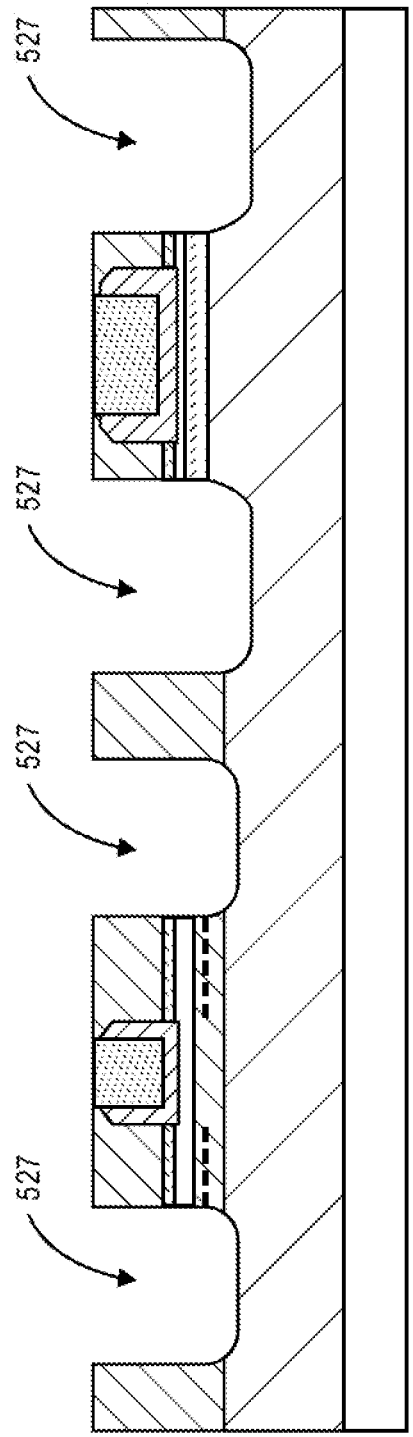
Figure 5L:
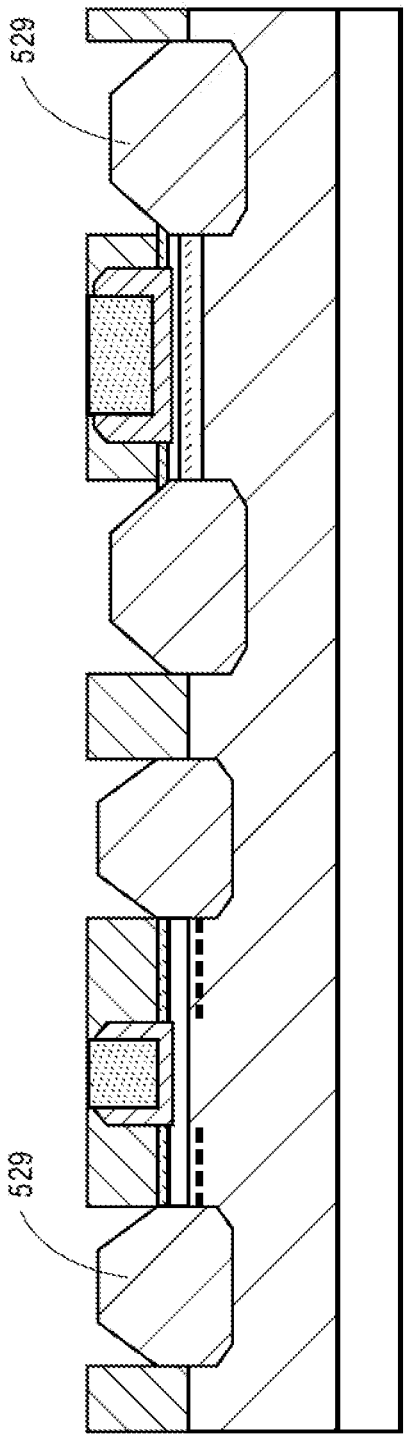
Figure 5M:
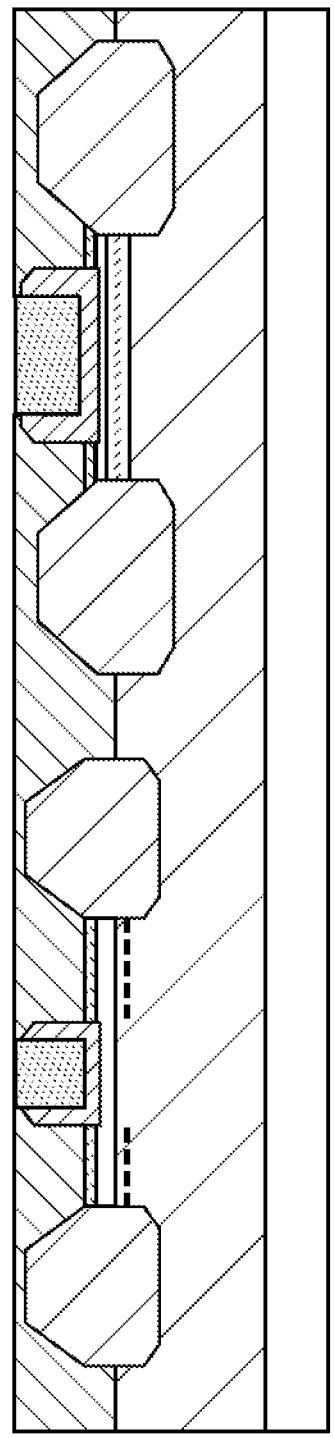
Figure 5N:
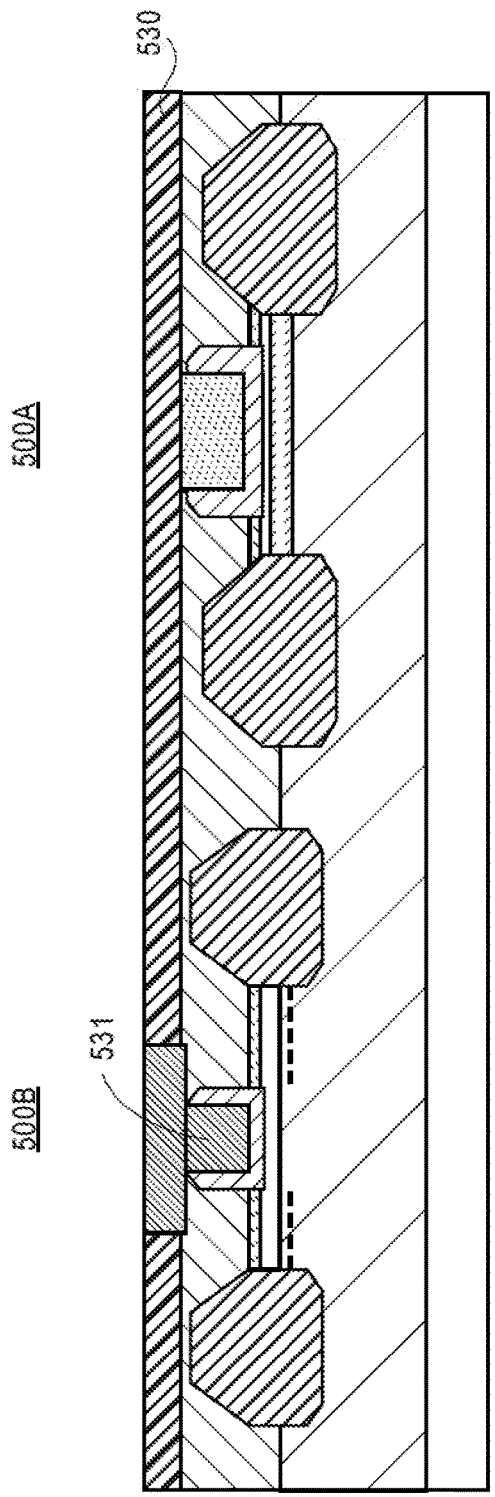
Figure 5O:
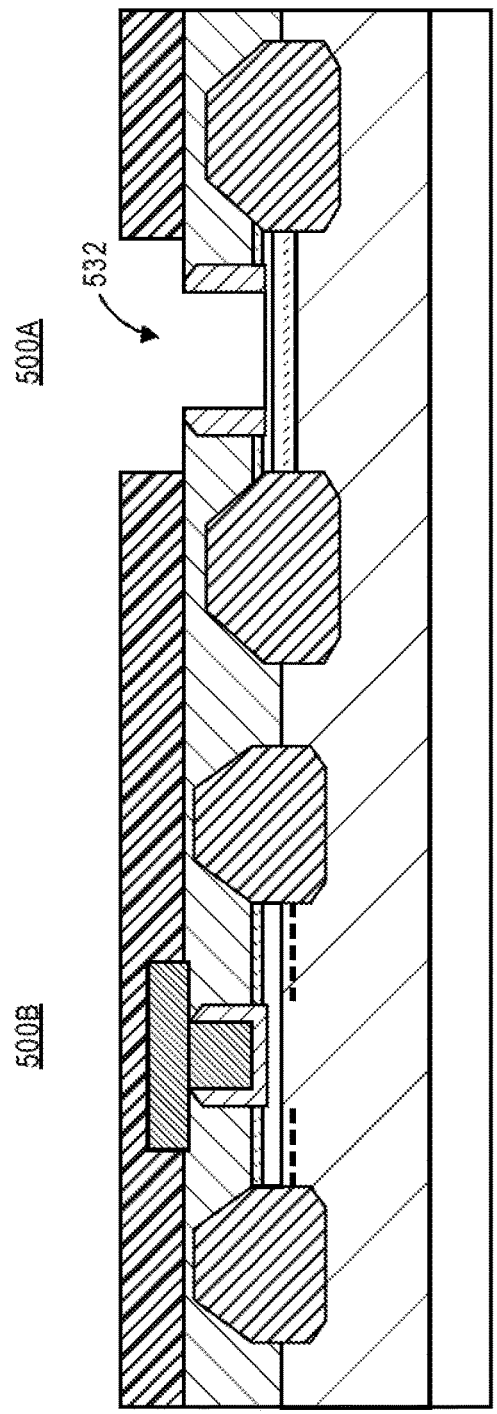
Figure 5P:
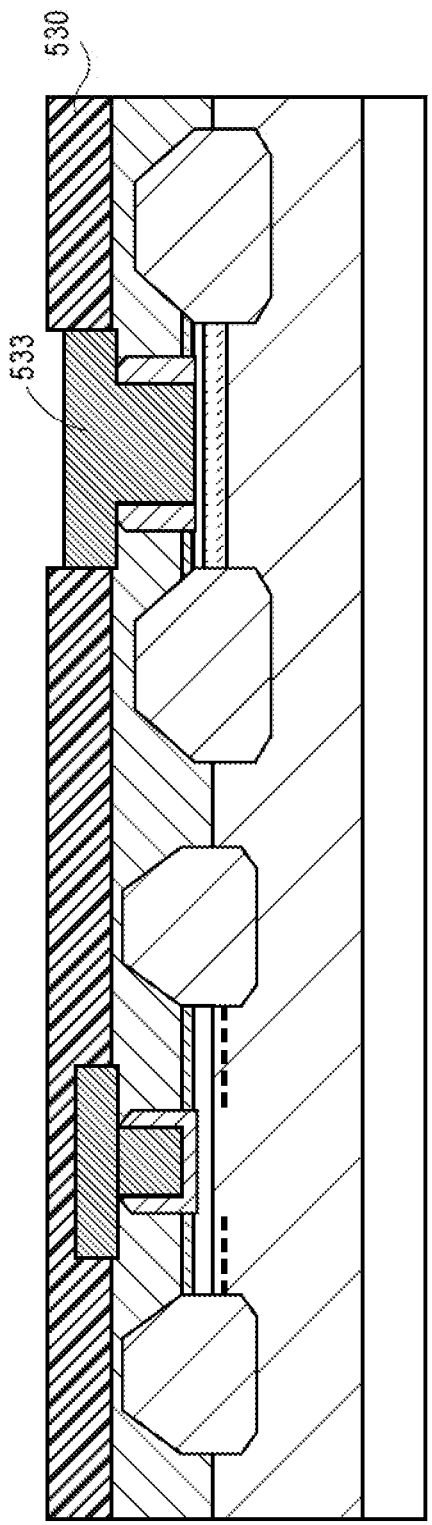
Figure 5Q:
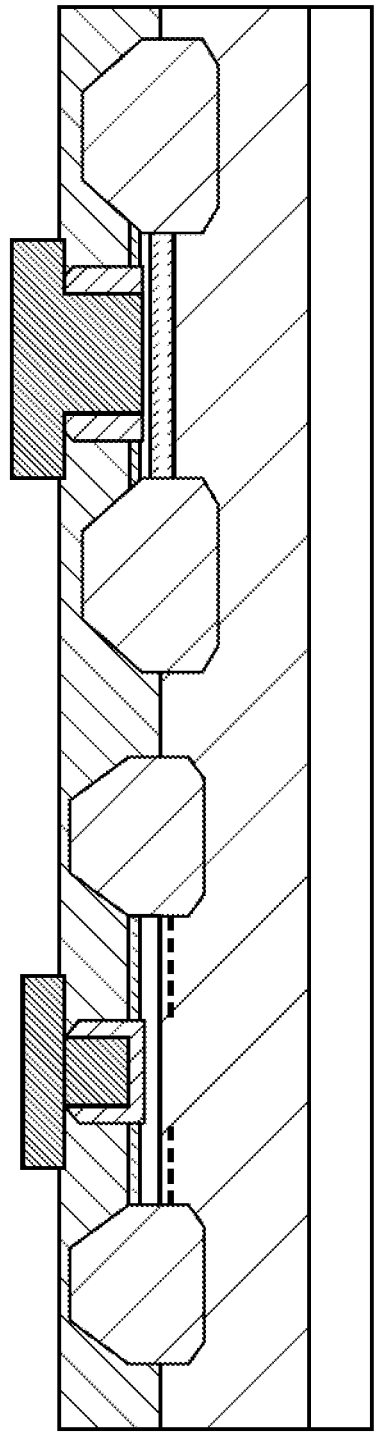

FIGS. 5A-5Q are illustrations of cross-sections of a semiconductor structure 500 during a process of fabrication of a diode that includes implants for increased lateral current conduction cross-section and an integrated transistor.

Referring to FIG. 5A, an epitaxial layer 503 is formed on a semiconductor substrate 501 and a semiconductor 505 is formed on the epitaxial layer 503.

Referring to FIG. 5B, after one or more operations that result in the cross-section shown in FIG. 5A, a hardmask 507 is formed on the semiconductor 505 and an etch is performed. From the etch trenches 509 are formed in the semiconductor structure 500 and extend into the epitaxial layer 503.

Referring to FIG. 5C, after one or more operations that result in the cross-section shown in FIG. 5B, the trenches 509 are filled with an STI oxide 511 and the surface of the semiconductor structure 500 is planarized to remove the hardmask 507 (see FIG. 5D).

Referring to FIG. 5D, after one or more operations that result in the cross-section shown in FIG. 5C, a mask 512 is formed on the surface of the semiconductor structure 500 and a region of the epitaxial layer exposed. Impurities are implanted 513 in the exposed region 512A of the epitaxial layer 503 of semiconductor structure 500 and activated.

Referring to FIG. 5E, after one or more operations that result in the cross-section shown in FIG. 5D, a silicon nitride layer 515 is formed on the insulator 505 and a polysilicon layer 517 is formed on the silicon nitride layer 515.

Referring to FIG. 5F, after one or more operations that result in the cross-section shown in FIG. 5E, the polysilicon layer 517 is patterned.

Referring to FIG. 5G, after one or more operations that result in the cross-section shown in FIG. 5F, silicon nitride 519 is formed above the remaining polysilicon layer 517.

Referring to FIG. 5H, after one or more operations that result in the cross-section shown in FIG. 5G, the silicon nitride 519 is etched to form spacers 521.

Referring to FIG. 5I, after one or more operation that result in the cross-section shown in FIG. 5H, a polarization layer 523 is formed on the surface of the semiconductor structure 500.

Referring to FIG. 5J after one or more operations that result in the cross-section shown in FIG. 5I, a mask 525 is formed on the top surface of semiconductor structure 500.

Referring to FIG. 5K, after one or more operations that result in the cross-section shown in FIG. 5J, trenches 527 are formed using the mask 525.

Referring to FIG. 5L, after one or more operations that result in the cross-section shown in FIG. 5K, the trenches 527 are filled with source and drain material 529 (and cathode material in the region of the Schottky diode).

Referring to FIG. 5M, after one or more operations that result in the cross-section shown in FIG. 5L, spaces in the surface of the semiconductor structure 500 are filled with insulator material and planarized.

Referring to FIG. 5N, after one or more operations that result in the cross-section shown in FIG. 5M, a mask 530 is formed on the surface of the semiconductor structure 500 and the dummy gate of the transistor 500B is replaced with metal 531.

Referring to FIG. 5O, after one or more operations that result in the cross-section shown in FIG. 5N, the dummy gate of the Schottky diode 500A is removed and a space 532 is formed by the removal of the dummy gate.

Referring to FIG. 5P, after one or more operations that result in the cross-section shown in FIG. 5O, the space 532 formed by the removal of the dummy gate is filled with gate metal 533. In an embodiment, the resulting gate has a T-gate structure. In other embodiments, the resulting gate has other structures.

Referring to FIG. 5Q, after one or more operations that result in the cross-section shown in FIG. 5P, the mask 530 is removed.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide (SiO2) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide (SiO2), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 6:
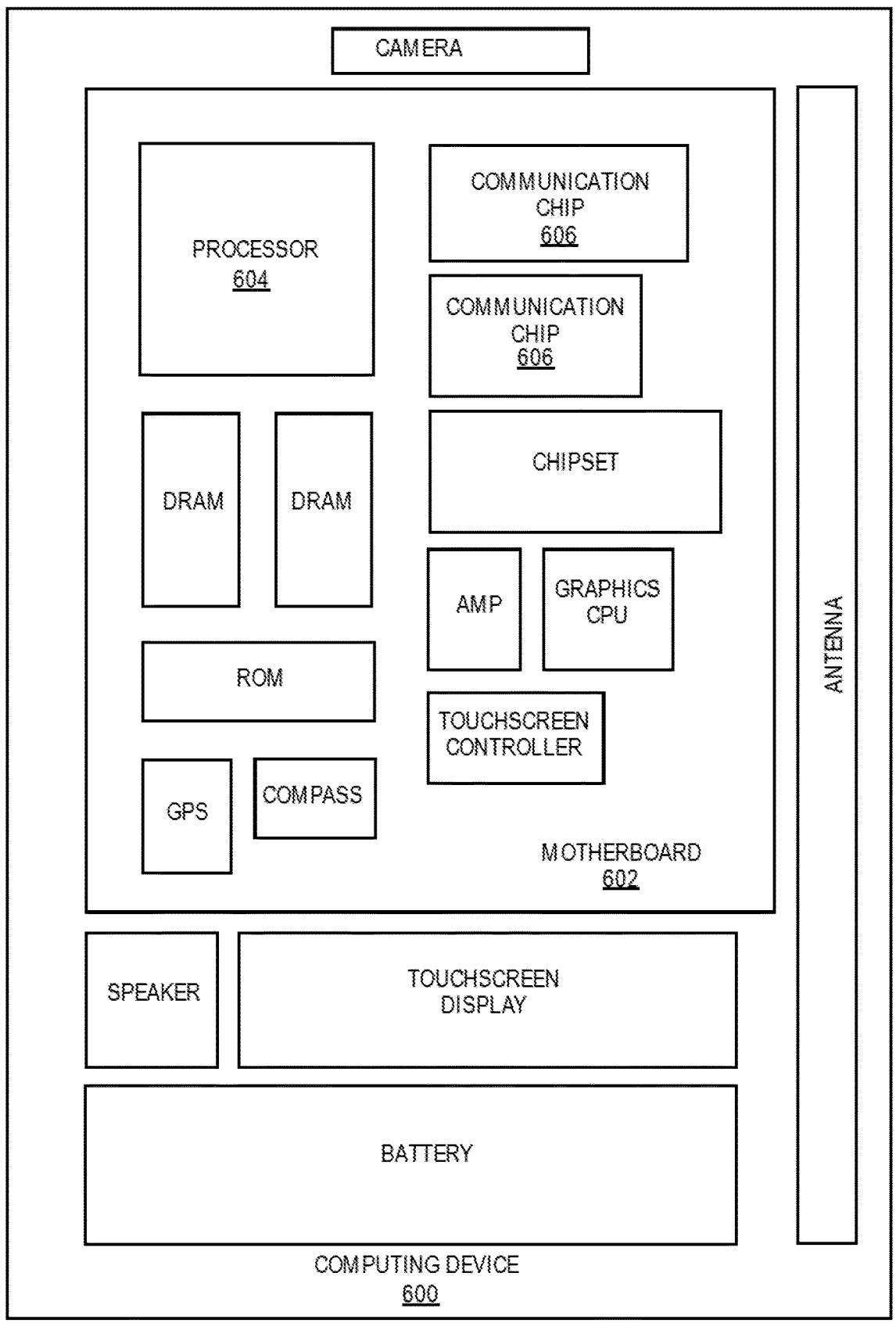
FIG. 6 illustrates a computing device in accordance with one implementation of an embodiment of the present disclosure.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip includes one or more devices, such as MOS-FET transistors built in accordance with implementations of the invention.

In further implementations, another component housed within the computing device 600 may contain an integrated circuit die that includes one or more devices, such as MOS-FET transistors built in accordance with implementations of the invention.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Figure 7:
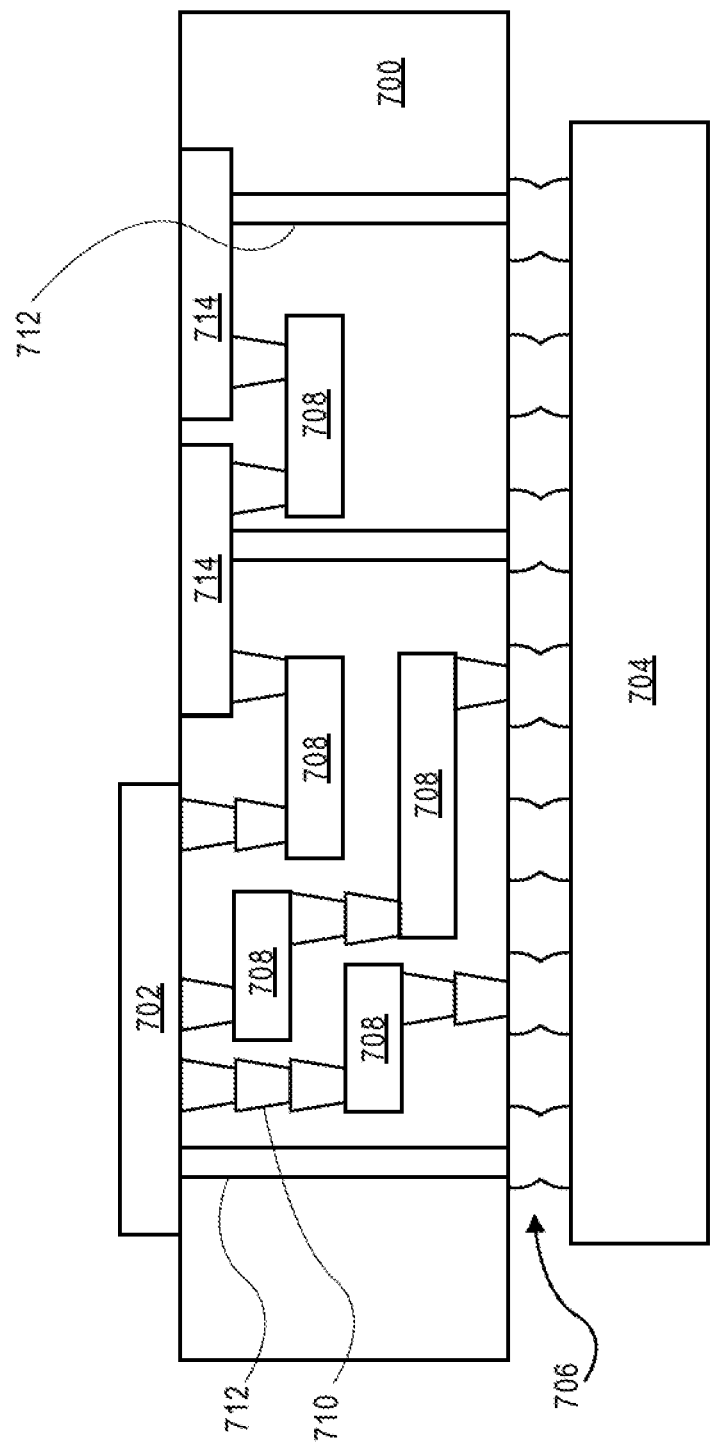
FIG. 7 is an interposer implementing one or more embodiments of the disclosure.

FIG. 7 illustrates an interposer 700 that includes one or more embodiments of the invention. The interposer 700 is an intervening substrate used to bridge a first substrate 702 to a second substrate 704. The first substrate 702 may be, for instance, an integrated circuit die. The second substrate 704 may be, for instance, a memory module, a computer motherboard, or another integrated circuit die. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700. In accordance with embodiments of the invention, apparatuses or processes disclosed herein may be used in the fabrication of interposer 700.

Example embodiment 1: A semiconductor device includes a substrate, an epitaxial layer above the substrate, a Schottky barrier material on the epitaxial layer, a Schottky metal contact extending into the Schottky barrier material, a fin structure that extends in a first direction, a first angled implant in a first side of the fin structure that has an orientation that is orthogonal to the first direction, and a second angled implant in a second side of the fin structure that has an orientation that is orthogonal to the first direction. The second side is opposite the first side. A first cathode region and a second cathode region are coupled by parts of the first angled implant and the second angled implant that extend in the first direction.

Example embodiment 2: The semiconductor device of example embodiment 1, wherein the Schottky metal contact extends through a hard mask into the Schottky barrier material above the first angled implant and the second angled implant.

Example embodiment 3: The semiconductor device of example embodiment 1, wherein the first angled implant and the second angled implant merge within the fin structure.

Example embodiment 4: The semiconductor device of example embodiment 1, wherein the first cathode region and the second cathode region include epitaxial material that extends downward into the first angled implant and the second angled implant.

Example embodiment 5: The semiconductor device of example embodiment 1, wherein the first angled implant and the second angled implant extend into the epitaxial layer.

Example embodiment 6: The semiconductor device of example embodiment 1, wherein the epitaxial layer comprises gallium nitride.

Example embodiment 7: The semiconductor device of example embodiment 1, wherein the substrate comprises silicon.

Example embodiment 8: The semiconductor device of example embodiment 1, 2, 3, 4, 5, 6, or 7, wherein a buffer layer is on the top surface of the substrate.

Example embodiment 9: A semiconductor diode includes a substrate, a Schottky metal contact above the substrate, a Schottky barrier material underneath the Schottky metal contact, a first cathode region and a second cathode region, and an epitaxial layer below the first cathode region and the second cathode region. An implant is made in a top surface of the epitaxial layer between the first cathode region and the second cathode region.

Example embodiment 10: The semiconductor diode of example embodiment 9, wherein the Schottky metal contact is formed above the implant.

Example embodiment 11: The semiconductor diode of example embodiment 9, wherein the Schottky barrier material extends between the first cathode region and the second cathode region.

Example embodiment 12: The semiconductor diode of example embodiment 9, wherein the Schottky metal contact has a T-gate structure.

Example embodiment 13: The semiconductor diode of example embodiment 9, wherein the Schottky metal contact has a first spacer adjacent a first side and a second spacer adjacent a second side.

Example embodiment 14: The semiconductor diode of example embodiment 8, wherein the epitaxial layer comprises gallium nitride.

Example embodiment 15: The semiconductor diode of example embodiment 8, wherein the substrate includes silicon.

Example embodiment 16: The semiconductor diode of example embodiment 9, 10, 11, 12, 13, 14 or 15 wherein the first spacer and the second spacer comprise SiN.

Example embodiment 17: A method includes forming a substrate, forming an epitaxial layer above the substrate, forming a Schottky barrier material on the epitaxial layer, forming a Schottky metal contact extending into the Schottky barrier material, forming a fin structure that extends in a first direction, forming a first angled implant in a first side of the fin structure that has an orientation that is orthogonal to the first direction, and forming a second angled implant in a second side of the fin structure that has an orientation that is orthogonal to the first direction. The second side is opposite the first side. Forming a first cathode region and a second cathode region that are coupled by parts of the first angled implant and the second angled implant that extend in the first direction.

Example embodiment 18: The method example embodiment 17, wherein the Schottky metal contact extends through a hard mask into the Schottky barrier material above the first angled implant and the second angled implant.

Example embodiment 19: The method of example embodiment 17, wherein the first angled implant and the second angled implant merge within the fin structure.

Example embodiment 20: The method of example embodiment 17, 18 or 19 wherein the first cathode region and the second cathode region include epitaxial material that extends downward into the first angled implant and the second angled implant.

What is claimed is:

1. A semiconductor device, comprising:
  a substrate;
  an epitaxial layer above the substrate;
  a Schottky barrier material on the epitaxial layer;
  a Schottky metal contact extending into the Schottky barrier material;
  a fin structure that extends in a first direction;
  a first angled implant in a first side of the fin structure that has an orientation that is orthogonal to the first direction;
  a second angled implant in a second side of the fin structure that has an orientation that is orthogonal to the first direction, the second side opposite the first side; and
  a first cathode region and a second cathode region coupled by parts of the first angled implant and the second angled implant that extend in the first direction.

2. The semiconductor device of claim 1, wherein the Schottky metal contact extends through a hard mask into the Schottky barrier material above the first angled implant and the second angled implant.

3. The semiconductor device of claim 1, wherein the first angled implant and the second angled implant merge within the fin structure.

4. The semiconductor device of claim 1, wherein the first cathode region and the second cathode region include epitaxial material that extends downward into the first angled implant and the second angled implant.

5. The semiconductor device of claim 1, wherein the first angled implant and the second angled implant extend into the epitaxial layer.

6. The semiconductor device of claim 1, wherein the epitaxial layer comprises gallium nitride.

7. The semiconductor device of claim 1, wherein the substrate comprises silicon.

8. The semiconductor device of claim 1, wherein a buffer layer is on the top surface of the substrate.

9. A semiconductor diode, comprising:
a substrate;
a Schottky metal contact above the substrate, the Schottky metal contact having a bottommost surface;
a Schottky barrier material underneath the Schottky metal contact;
a first cathode region and a second cathode region, the first cathode region and the second cathode region having an uppermost surface above the bottommost surface of the Schottky metal contact, and the first cathode region and the second cathode region having a bottommost surface;
an epitaxial layer having a portion below the first cathode region and the second cathode region, the epitaxial layer having an uppermost surface above the bottommost surface of the first cathode region and the second cathode region; and
an implant in a top surface of the epitaxial layer between the first cathode region and the second cathode region.

10. The semiconductor diode of claim 9, wherein the Schottky metal contact is formed above the implant.

11. The semiconductor diode of claim 9, wherein the Schottky barrier material extends between the first cathode region and the second cathode region.

12. The semiconductor diode of claim 9, wherein the Schottky metal contact has a T-gate structure.

13. The semiconductor diode of claim 9, wherein the Schottky metal contact has a first spacer adjacent a first side and a second spacer adjacent a second side.

14. The semiconductor diode of claim 9, wherein the epitaxial layer comprises gallium nitride.

15. The semiconductor diode of claim 9, wherein the substrate includes silicon.

16. The semiconductor diode of claim 13, wherein the first spacer and the second spacer comprise silicon nitride.

17. A method, comprising:
forming a substrate;
forming an epitaxial layer above the substrate;
forming a Schottky barrier material on the epitaxial layer;
forming a Schottky metal contact extending into the Schottky barrier material;
forming a fin structure that extends in a first direction;
forming a first angled implant in a first side of the fin structure that has an orientation that is orthogonal to the first direction;
forming a second angled implant in a second side of the fin structure that has an orientation that is orthogonal to the first direction, the second side opposite the first side; and
forming a first cathode region and a second cathode region coupled by parts of the first angled implant and the second angled implant that extend in the first direction.

18. The method claim 17, wherein the Schottky metal contact extends through a hard mask into the Schottky barrier material above the first angled implant and the second angled implant.

19. The method of claim 17, wherein the first angled implant and the second angled implant merge within the fin structure.

20. The method of claim 17, wherein the first cathode region and the second cathode region include epitaxial material that extends downward into the first angled implant and the second angled implant.

21. A semiconductor diode, comprising:
a substrate;
a Schottky metal contact above the substrate, wherein the Schottky metal contact has a first spacer adjacent a first side and a second spacer adjacent a second side, and wherein the first spacer and the second spacer comprise silicon nitride;
a Schottky barrier material underneath the Schottky metal contact;
a first cathode region and a second cathode region;
an epitaxial layer below the first cathode region and the second cathode region; and
an implant in a top surface of the epitaxial layer between the first cathode region and the second cathode region.

* * * * *